(12) United States Patent
Eichler et al.

(10) Patent No.: US 11,056,857 B2
(45) Date of Patent: Jul. 6, 2021

(54) LASER DIODE

(71) Applicant: OSRAM OLED GmbH, Regensburg (DE)

(72) Inventors: Christoph Eichler, Donaustauf (DE); Matthias Peter, Regensburg (DE); Jan Wagner, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/642,610

(22) PCT Filed: Sep. 19, 2018

(86) PCT No.: PCT/EP2018/075384
§ 371 (c)(1),
(2) Date: Feb. 27, 2020

(87) PCT Pub. No.: WO2019/057789
PCT Pub. Date: Mar. 28, 2019

(65) Prior Publication Data
US 2020/0220330 A1 Jul. 9, 2020

(30) Foreign Application Priority Data
Sep. 22, 2017 (DE) .................... 10 2017 122 032.1

(51) Int. Cl.
*H01S 5/00* (2006.01)
*H01S 5/32* (2006.01)
(Continued)

(52) U.S. Cl.
CPC ............ *H01S 5/3215* (2013.01); *H01S 5/026* (2013.01); *H01S 5/2009* (2013.01);
(Continued)

(58) Field of Classification Search
CPC ...... H01S 5/3407; H01S 5/026; H01S 5/2009; H01S 5/3054; H01S 5/3063;
(Continued)

(56) References Cited

U.S. PATENT DOCUMENTS

| | | | |
|---|---|---|---|
| 5,555,271 A * | 9/1996 | Honda | B82Y 20/00 372/45.01 |
| 5,960,019 A * | 9/1999 | Hayashi | B82Y 20/00 372/46.01 |

(Continued)

FOREIGN PATENT DOCUMENTS

| CN | 101165979 A | 4/2008 |
|---|---|---|
| CN | 101741010 A | 6/2010 |

(Continued)

*Primary Examiner* — Kinam Park
(74) *Attorney, Agent, or Firm* — DLA Piper LLP (US)

(57) ABSTRACT

A laser diode having a semiconductor layer sequence based on a nitride compound semiconductor material includes an n-type cladding layer, a first waveguide layer, a second waveguide layer and an active layer, and a p-type cladding layer including a first partial layer and a second partial layer, wherein the first partial layer includes $Al_{x1}Ga_{1-x1}N$ with $0 \leq x1 \leq 1$ or $Al_{x1}In_{y1}Ga_{1-x1-y1}N$ with $0 \leq x1 \leq 1$, $0 \leq y1 < 1$ and $x1+y1 \leq 1$, the aluminum content x1 decreases in a direction pointing away from the active layer so that the aluminum content has a maximum value $x1_{max}$ and a minimum value $x1_{min} < x1_{max}$, and the second partial layer includes $Al_{x2}Ga_{1-x2}N$ with $0 \leq x2 \leq x1_{min}$ or $Al_{x2}In_{y2}Ga_{1-x2-y2}N$ with $0 \leq x2 \leq x1_{min}$, $0 \leq y2 < 1$ and $x2+y2 \leq 1$.

18 Claims, 6 Drawing Sheets

(51) Int. Cl.
*H01S 5/026* (2006.01)
*H01S 5/20* (2006.01)
*H01S 5/30* (2006.01)
*H01S 5/34* (2006.01)
*H01S 5/343* (2006.01)
*H01S 5/042* (2006.01)

(52) U.S. Cl.
CPC .......... *H01S 5/3054* (2013.01); *H01S 5/3063* (2013.01); *H01S 5/3209* (2013.01); *H01S 5/3213* (2013.01); *H01S 5/04253* (2019.08); *H01S 5/3407* (2013.01); *H01S 5/34333* (2013.01)

(58) Field of Classification Search
CPC ............. H01S 5/04253; H01S 5/34333; H01S 5/3213; H01S 5/3215; H01S 5/3219
See application file for complete search history.

(56) References Cited

U.S. PATENT DOCUMENTS

| | | | |
|---|---|---|---|
| 6,603,147 B1* | 8/2003 | Hashimoto | H01L 33/32 257/103 |
| 7,471,711 B2* | 12/2008 | Kuramoto | B82Y 20/00 372/43.01 |
| 7,724,795 B2 | 5/2010 | Son et al. | |
| 8,916,849 B2 | 12/2014 | Eichler et al. | |
| 2008/0043797 A1* | 2/2008 | Takayama | H01S 5/22 372/50.12 |
| 2009/0080484 A1 | 3/2009 | Shigihara | |
| 2010/0118905 A1 | 5/2010 | Yabushita et al. | |
| 2011/0243171 A1 | 10/2011 | Kano | |
| 2012/0327967 A1* | 12/2012 | Enya | H01L 21/02389 372/45.011 |
| 2013/0329760 A1 | 12/2013 | Bhat et al. | |
| 2016/0240734 A1* | 8/2016 | Avramescu | H01S 5/3063 |
| 2017/0222087 A1 | 8/2017 | Eichler et al. | |
| 2019/0013649 A1 | 1/2019 | Vierheilig et al. | |

FOREIGN PATENT DOCUMENTS

| | | |
|---|---|---|
| CN | 102771023 A | 11/2012 |
| CN | 103403985 A | 11/2013 |
| DE | 10 2014 111 058 A1 | 2/2016 |
| DE | 10 2015 116 336 A1 | 3/2017 |
| JP | 2005-159204 A | 6/2005 |

* cited by examiner

LASER DIODE

TECHNICAL FIELD

This disclosure relates to a laser diode, in particular an edge emitting laser diode based on a nitride compound semiconductor material.

BACKGROUND

The semiconductor layer sequence of a laser diode typically has a waveguide region having an active layer disposed between a first waveguide layer and a second waveguide layer. The waveguide region is typically sandwiched between an n-type cladding layer and a p-type cladding layer.

To achieve high efficiency, laser diodes should have a low voltage drop. Due to the conductivity and relatively large thickness, the p-type cladding layer in particular plays a major role in the voltage drop. In laser diodes based on nitride compound semiconductors, the p-type cladding layer is made of magnesium-doped p-type AlGaN, for example, since AlGaN has a lower refractive index than GaN or InGaN and is therefore suitable for shielding the optical wave from the p-contact. However, with increasing aluminum content, the activation energy for the dopant magnesium also increases, and at the same time mobility of the holes decreases, resulting in low electrical conductivity. Therefore, the p-type cladding layer usually strongly contributes to the series resistance of the laser diode.

It could therefore be helpful to provide a laser diode with an improved p-type cladding layer having a reduced voltage drop.

SUMMARY

We provide a laser diode having a semiconductor layer sequence based on a nitride compound semiconductor material, including an n-type cladding layer, a first waveguide layer, a second waveguide layer and an active layer that generates laser radiation disposed between the first waveguide layer and the second waveguide layer, and a p-type cladding layer including a first partial layer facing the active layer and a second partial layer facing away from the active layer, wherein the first partial layer includes $Al_{x1}Ga_{1-x1}N$ with $0 \leq x1 \leq 1$ or $Al_{x1}In_{y1}Ga_{1-x1-y1}N$ with $0 \leq x1 \leq 1$, $0 \leq y1 < 1$ and $x1+y1 \leq 1$, the aluminum content x1 decreases in a direction pointing away from the active layer so that the aluminum content has a maximum value $x1_{max}$ on a side facing the active layer and a minimum value $x1_{min} \leq x1_{max}$ on a side remote from the active layer, and the second partial layer includes $Al_{x2}Ga_{1-x2}N$ with $0 \leq x2 \leq x1_{min}$ or $Al_{x2}In_{y2}Ga_{1-x2-y2}N$ with $0 \leq x2 \leq x1_{min}$, $0 \leq y2 < 1$ and $x2+y2 \leq 1$.

We also provide a laser diode having a semiconductor layer sequence based on a nitride compound semiconductor material, including an n-type cladding layer, a first waveguide layer, a second waveguide layer and an active layer that generates laser radiation disposed between the first waveguide layer and the second waveguide layer, and a p-type cladding layer including a first partial layer facing the active layer and a second partial layer facing away from the active layer, wherein the first partial layer includes $Al_{x1}Ga_{1-x1}N$ with $0 \leq x1 \leq 1$ or $Al_{x1}In_{y1}Ga_{1-x1-y1}N$ with $0 \leq x1 \leq 1$, $0 \leq y1 < 1$ and $x1+y1 \leq 1$, the aluminum content x1 decreases in a direction pointing away from the active layer so that the aluminum content has a maximum value $x1_{max}$ on a side facing the active layer and a minimum value $x1_{min} \leq x1_{max}$ on a side remote from the active layer, the second partial layer includes $Al_{x2}Ga_{1-x2}N$ with $0 \leq x2 \leq x1_{min}$ or $Al_{x2}In_{y2}Ga_{1-x2-y2}N$ with $0 \leq x2 \leq x1_{min}$, $0 \leq y2 \leq 1$ and $x2+y2 \leq 1$, and the dopant concentration in the second partial layer is higher or rises to a higher value at least in some areas than in the first partial layer.

REFERENCES 1 substrate
2 n-type cladding layer
3A first waveguide layer
3B second waveguide layer
3C further waveguide layer
3D further waveguide layer
4 active layer
5 electron barrier layer
6 p-type cladding layer
6A first partial layer
6B second partial layer
6C third partial layer
7 p-contact layer
8 transparent conductive oxide layer
9 p-connection layer
10 laser diode
11 n-connection layer
12 semiconductor layer sequence

DETAILED DESCRIPTION

Our laser diode may comprise a semiconductor layer sequence based on a nitride compound semiconductor material. "Based on a nitride compound semiconductor" means that the semiconductor layer sequence or at least one layer thereof comprises a III-nitride compound semiconductor material, preferably $In_xAl_yGa_{1-x-y}N$, where $0 \leq x \leq 1$, $0 \leq y \leq 1$ and $x+y \leq 1$, wherein this material does not necessarily have a mathematically exact composition according to the above formula. Rather, it may have one or more dopants and additional components. For simplicity's sake, however, the above formula only includes essential components of the crystal lattice (In, Al, Ga, N), even if they may be partially replaced by small amounts of other substances. Laser diodes based on a nitride compound semiconductor are, depending on the material composition, particularly suitable for emitting radiation in the spectral range of ultraviolet, blue or green light.

The laser diode may comprise an n-type cladding layer, a first waveguide layer, an active layer, a second waveguide layer and a p-type cladding layer. These layers are in particular arranged in the order mentioned, wherein this does not exclude that one or more further layers are arranged between the layers mentioned. The active layer is in particular arranged between the first waveguide layer and the second waveguide layer, whereby, viewed from the active layer, the first waveguide layer faces the n-type cladding layer and the second waveguide layer faces the p-type cladding layer. The first waveguide layer, the active layer and the second waveguide layer advantageously form a waveguide region enclosed by the cladding layers, the cladding layers having a lower refractive index than the waveguide layers and thus causing waveguiding of the laser radiation generated in the active layer in the waveguide region.

The active layer can, for example, be configured as a pn junction, a double heterostructure, a single quantum well structure or a multiple quantum well structure. The term quantum well structure includes any structure in which charge carriers are quantized by confinement of their energy states. In particular, the term quantum well structure does not contain any information about the dimensionality of the quantization. It therefore includes quantum wells, quantum wires and quantum dots and any combination of these structures.

The p-type cladding layer may have a first partial layer facing the active layer and a second partial layer facing away from the active layer. The first partial layer advantageously comprises $Al_{x1}Ga_{1-x1}N$ with $0 \leq x1 \leq 1$ or $Al_{x1}In_{y1}Ga_{1-x1-y1}N$ with $0 \leq x1 \leq 1$, $0 \leq y1 < 1$ and $x1+y1 \leq 1$, wherein the aluminum content x1 in the first partial layer decreases in a direction away from the active layer. In other words, the first partial layer has a gradient of the aluminum content x1. The aluminum content preferably decreases continuously, for example, linearly in the direction away from the active layer. The aluminum content in the first partial layer can particularly decrease strictly monotonically. The aluminum content x1 of the first partial layer has a maximum value $x1_{max}$ on a side facing the active layer—and a minimum value $x1_{min} < x1_{max}$ on a side facing away from the active layer. In an example, the gradient of the aluminum content can be realized by a layer sequence of partial layers with gradually decreasing aluminum content, whereby the envelope of the aluminum content approximately corresponds to a continuous gradient.

Furthermore, the p-type cladding layer has a second partial layer that follows the first partial layer as seen from the active layer. In the second partial layer the aluminum content is lower than in the first partial layer, in particular the aluminum content in the entire second partial layer is lower than in the first partial layer. The second partial layer comprises in particular $Al_{x2}Ga_{1-x2}N$ with $0 \leq x2 \leq x1_{min}$ or $Al_{x2}In_{y2}Ga_{1-x2-y2}N$ with $0 \leq x2 \leq x1_{min}$, $0 \leq y2 < 1$ and $x2+y2 \leq 1$. The aluminum content in the second partial layer can be in particular x2=0, i.e. the second partial layer comprises advantageously GaN.

If the first and/or second partial layer have an indium content, it is preferably very low, e.g. $y1 \leq 0.01$ and $y2 \leq 0.01$. It is particularly preferred that the first partial layer and the second partial layer do not contain any indium, i.e. y1=0 and y2=0.

Due to the comparatively high aluminum content on the side of the p-type cladding layer facing the active layer compared to the rest of the p-type cladding layer, the refractive index on this side is comparatively low so that good wave guidance is achieved in the waveguide region. The laser radiation propagating in the waveguide region thus only slightly penetrates the p-type cladding layer and is thus shielded by the more strongly absorbing p-type semiconductor material. In this way, a reduced absorption, a higher steepness of the laser characteristic curve and an increased operating current intensity can be achieved. Due to the gradient of the aluminum content in the first partial layer of the p-type cladding layer, in which the aluminum content decreases when viewed in the direction of growth, the piezoelectric effect advantageously increases the charge carrier density, resulting in improved conductivity.

The aluminum content $x1_{max}$ of the first partial layer on a side facing the active layer is advantageously at least 0.05, preferably at least 0.08 and particularly preferably at least 0.12. The greater the aluminum content, the greater the electronic band gap and the lower the refractive index of the semiconductor material. A high aluminum content therefore provides a good charge carrier barrier and good optical wave guidance. On the other hand, the aluminum content should not be too high, because with increasing aluminum content of the $Al_{x1}Ga_{1-x1}N$ semiconductor material, the activation energy for a p-type dopant such as magnesium in particular increases and at the same time the hole mobility decreases so that the conductivity would decrease. Advantageously, the aluminum content $x1_{max}$ on a side of the first partial layer facing the active layer is not more than 0.35, preferably not more than 0.25 and particularly preferably not more than 0.20.

Advantageously, the first partial layer of the p-type cladding layer may have an aluminum content of $0.05 \leq x1_{max} \leq 0.35$ on a side facing the active layer, preferably $0.08 \leq x1_{max} \leq 0.25$ and particularly preferably $0.12 \leq x1_{max} \leq 0.20$.

On a side facing away from the active layer, the first partial layer of the p-type cladding layer has a lower aluminum content than on the side facing the active layer. The first partial layer on a side facing away from the active layer may have an aluminum content of $0 \leq x1_{min} \leq 0.30$, preferably $0.03 \leq x1_{min} \leq 0.15$ and particularly preferably $0.05 \leq x1_{min} \leq 0.10$.

The first partial layer of the p-type cladding layer is followed by a second partial layer on the side facing away from the active layer and in particular directly adjoins the first partial layer. The second partial layer has advantageously $Al_{x2}Ga_{1-x2}N$ with $0 \leq x2 \leq 0.1$, wherein preferably $0 \leq x2 \leq 0.05$ and particularly preferably $0 \leq x2 \leq 0.01$ applies.

Advantageously, the second partial layer may be free of aluminum. In particular, the second partial layer comprises or consists of GaN. The second partial layer with the lower aluminum content or even no aluminum content at all has the advantage that low series resistance and low optical absorption can be achieved.

The first partial layer may be less than 300 nm thick. A small thickness of the first partial layer is advantageous since it contributes more to the series resistance due to the higher aluminum content. Preferably, the first partial layer is less than 150 nm and especially preferred less than 100 nm thick.

The second partial layer is preferably thicker than the first partial layer. In particular, the first partial layer may contain aluminum and the second partial layer may be free of aluminum, wherein the aluminum-free second partial layer is thicker than the first partial layer. Absorption is advantageously reduced by a high proportion of the aluminum-free part of the total thickness of the p-type cladding layer. The thickness of the second partial layer of the p-type cladding layer can be, for example, 100 nm to 2000 nm, preferably 200 nm to 1000 nm and especially preferably 300 nm to 900 nm.

A transparent conductive oxide layer may be arranged on a side of the p-type cladding layer facing away from the active layer. The transparent conductive oxide layer can directly adjoin the second partial layer of the p-type cladding layer. However, it is also possible that a further layer, in particular a p-type contact layer with a higher dopant concentration than in the second partial layer, is arranged between the second partial layer and the transparent conductive oxide layer. The transparent conductive oxide layer preferably contains ITO or ZnO. The transparent conductive oxide layer is characterized by good electrical conductivity and thus enables a favorably thin p-type cladding layer.

Preferably, an electron barrier layer is placed between the second waveguide layer and the p-type cladding layer. The electron barrier layer comprises $Al_zGa_{1-z}N$, where the aluminum content z is greater than the aluminum content $x1_{max}$ of the first partial layer on a side facing the electron barrier layer. The aluminum content z of the electron barrier layer is advantageously 0.05 to 0.4, preferably 0.1 to 0.3 and particularly preferably 0.15 to 0.25. In this way the electron barrier layer has a large band gap. This prevents electrons from leaving the waveguide region. Furthermore, the large band gap results in a low refractive index, which is advantageously small compared to the waveguide layers. This improves the wave guidance in the waveguide region.

The first waveguide layer and/or the second waveguide layer may comprise InGaN. The indium content in the waveguide layers reduces the band gap and increases the refractive index. This is advantageous to achieve a high refractive index contrast to the cladding layers. On the other hand, the indium content should not be too large to not impair the material quality. The first and/or the second waveguide layer may in particular comprise $In_yGa_{1-y}N$ with $0.005 \leq y \leq 0.1$, preferably $In_yGa_{1-y}N$ with $0.02 \leq y \leq 0.07$ and particularly preferably $In_yGa_{1-y}N$ with $0.03 \leq y \leq 0.05$.

The laser diode is explained in more detail in the following on the basis of examples in connection with FIGS. 1A to 9.

The same or similarly acting components are marked with the same reference signs in the figures. The depicted components and the proportions of the components to each other are not to be regarded as true to scale.

Figure 1A:
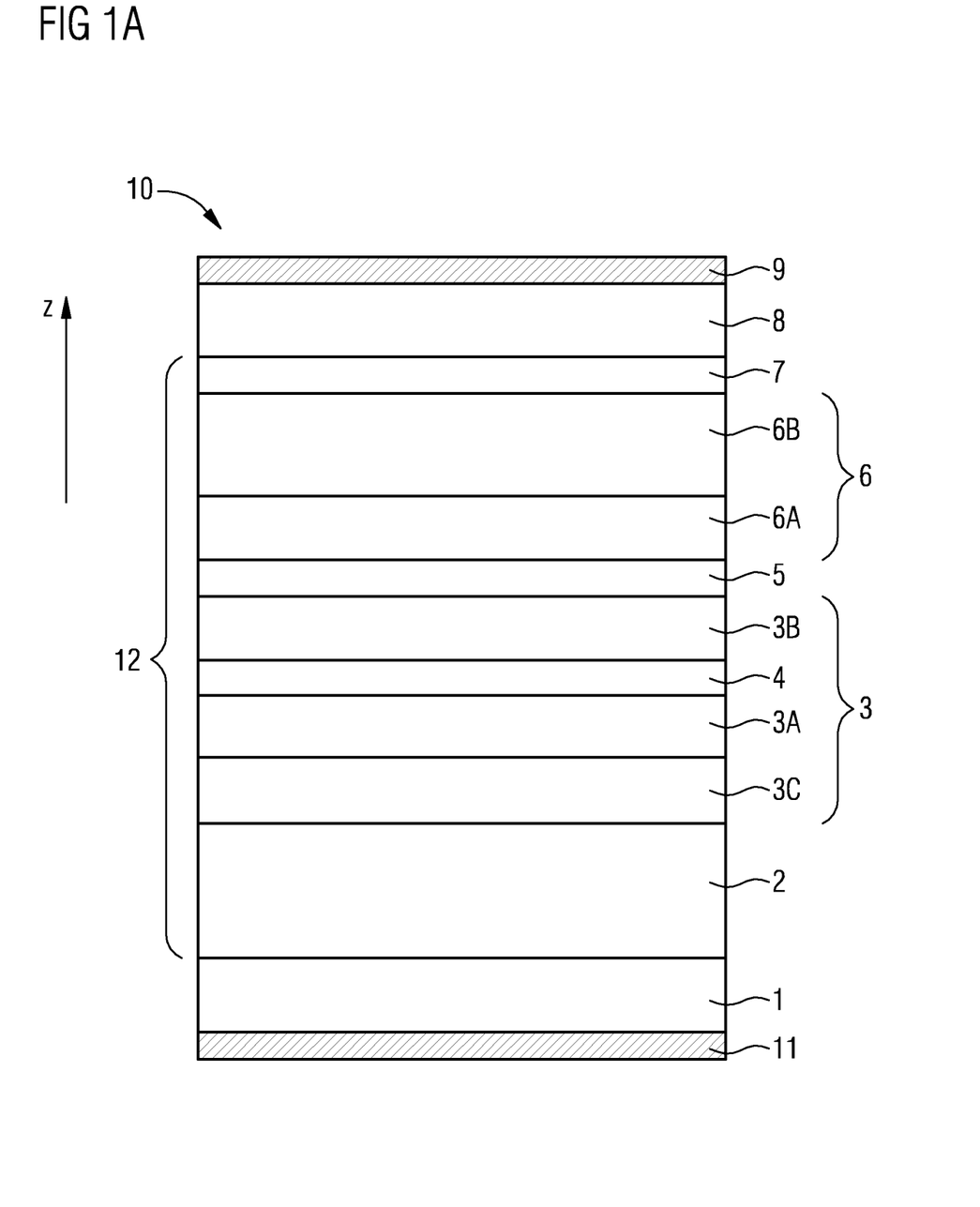
FIG. 1A shows a schematic representation of a cross section through a laser diode according to an example.

FIG. 1A shows a cross sectional view of an example of the laser diode. The laser diode 10 has a semiconductor layer sequence 12, grown in a growth direction z on a substrate 1. The semiconductor layer sequence 12 is based on a nitride compound semiconductor, i.e. the semiconductor layers of the semiconductor layer sequence 12 comprise in particular $In_xAl_yGa_{1-x-y}N$, where $0 \leq x \leq 1$, $0 \leq y \leq 1$ and $x+y \leq 1$. The substrate 1 is a substrate suitable for growing nitride compound semiconductors, preferably a GaN substrate.

To generate laser radiation, the laser diode 10 comprises an active layer 4 preferably configured as a single or multiple quantum well structure. The active layer 4 may comprise several partial layers, in particular a sequence of barrier layers and one or more quantum well layers, which are not shown individually in FIG. 1A for simplification.

The active layer 4 is arranged between a first waveguide layer 3A and a second waveguide layer 3B, the first waveguide layer 3A adjoining the active layer 4 at the n-side and the second waveguide layer 3B adjoining the active layer 4 at the p-side. In addition, a further waveguide layer 3C may be provided in a possible configuration, for example, arranged in front of the first waveguide layer 3A in the growth direction. The active layer 4 and the waveguide layers 3A, 3B, 3C form a waveguide region 3. The laser diode 10 is configured as an edge emitter laser diode that emits laser radiation perpendicular to the growth direction z, i.e. parallel to the layer plane of the active layer 4.

The waveguide region 3 is arranged between an n-type cladding layer 2 and a p-type cladding layer 6. To guide the laser radiation in the waveguide region 3, the n-type cladding layer 2 and the p-type cladding layer 6 have a lower refractive index than the waveguide layers 3A, 3B, 3C. This is realized, for example, by the fact that the cladding layers 2, 6 have a higher aluminum content and/or lower indium content than the waveguide layers 3A, 3B, 3C, at least in some areas, resulting in a larger electronic band gap and a lower refractive index.

Figure 1B:
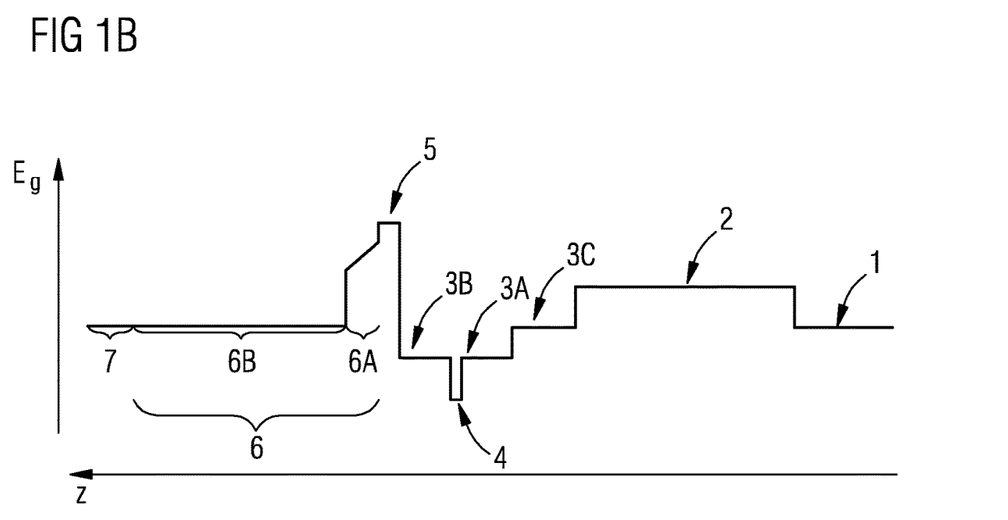
FIG. 1B shows a schematic diagram of the course of the band gap $E_g$ in the semiconductor layer sequence of the example of the laser diode according to FIG. 1A.

The course of the electronic band gap $E_g$ in the semiconductor layer sequence is shown schematically in FIG. 1B. In the laser diode 10, the p-type cladding layer 6 advantageously has a first partial layer 6A and a second partial layer 6B. The first partial layer 6A advantageously comprises $Al_{x1}Ga_{1-x1}N$, wherein the aluminum content x1 has a gradient. The aluminum content x1 decreases in the first partial layer 6A in the direction pointing away from the active layer, i.e. in the growth direction z of the semiconductor layer sequence 12. The aluminum content x1 and, correspondingly, the band gap $E_g$ decreases continuously, in particular linearly. The aluminum content x1 in the first partial layer 6A in particular decreases strictly monotonically.

The aluminum content x1 in the first partial layer 6A has a maximum value $x1_{max}$ on the side facing the active layer 4 and a minimum value $x1_{min}$ on the side facing away from the active layer. Advantageously, the following applies: $0.05 \leq x1_{max} \leq 0.35$, preferably $0.08 \leq x1_{max} \leq 0.25$ and especially preferred $0.12 \leq x1_{max} \leq 0.20$. For the minimum value $x1_{min}$ on the side facing away from the active layer 4 the following applies: advantageously $0 \leq x1_{min} \leq 0.30$, preferably $0.03 \leq x1_{min} \leq 0.15$ and especially preferred $0.05 \leq x1_{min} \leq 0.10$.

The first partial layer 6A is preferably a thin layer with a thickness of less than 300 nm, preferably of less than 150 nm and particularly preferably of less than 100 nm. The decreasing aluminum content and the small thickness have the advantage that the charge carrier density increases due to the piezoelectric effect and the absorption is low. Furthermore, the barrier effect for holes is only low, resulting in good injection efficiency and a low voltage drop. The steepness of the characteristic curve of the laser diode 10 can thus be increased.

In particular, the second partial layer 6B of the p-type cladding layer 6 can directly adjoin the first partial layer 6A and has an aluminum content not greater than the aluminum content $x_{min}$ of the first partial layer 6A on the side facing away from the active layer 4. The second partial layer 6B comprises in particular $Al_{x2}Ga_{1-x2}N$ with $0 \leq x2 \leq 0.1$, preferably $0 \leq x2 \leq 0.05$ and particularly preferably $0 \leq x2 \leq 0.01$. Preferably, the second partial layer 6B does not contain aluminum. The second partial layer 6B can be a GaN layer in particular. The thickness of the second partial layer 6B is preferably greater than the thickness of the first partial layer 6A.

The second partial layer of the p-type cladding layer 6 is followed by a p-contact layer 7 on the side facing away from the active layer 4. The p-contact layer 7 can be a GaN layer or an InGaN layer. The p-contact layer 7 is a p-doped layer, which is advantageously highly doped. The dopant concentration in the p-contact layer 7 is advantageously at least $5*10^{19}$ cm$^{-3}$, preferably at least $1*10^{20}$ cm$^{-3}$. The p-contact layer 7 can differ from the second partial layer 6B of the p-type cladding layer 6 in particular in that it has a higher dopant concentration. However, it is possible that the second partial layer 6B of the p-type cladding layer and the p-contact layer 7 have the same semiconductor material, for example, GaN apart from the different dopant concentration.

It is possible that the p-contact layer 7 directly adjoins a p-connection layer 9 that has a metal or a metal alloy, for example, and establishes an electrical contact. Furthermore, the laser diode 10 has an n-connection layer 11, for example, on a back side of the substrate. The n-connection layer 11 can have a metal or a metal alloy, for example.

In a preferred configuration as shown in FIG. 1A, a transparent conductive oxide layer 8 is placed between the p-contact layer 7 and the p-connection layer 9. The transparent conductive oxide layer 8 may in particular contain indium tin oxide (ITO) or zinc oxide (ZnO). In particular, the transparent conductive oxide layer 8 increases conductivity and reduces the refractive index, making it possible to make the p-type cladding layer 6 advantageously thin and thus reduce absorption.

In the example of FIGS. 1A and 1B, an optional electron barrier layer 5 is arranged between the second waveguide layer 3B and the first partial layer 6A of the p-type cladding layer 6. The electron barrier layer 5 preferably has an even greater aluminum content and accordingly an even greater band gap than the first partial layer 6A of the p-type cladding layer 6. The aluminum content in the electron barrier layer 5 can in particular be equal to or greater than the aluminum content $x1_{max}$ of the first partial layer 6A of the p-type cladding layer 6 on the side facing the active layer 4.

The electron barrier layer 5 can in particular comprise $Al_zGa_{1-z}N$, the aluminum content z being 0.05 to 0.4, preferably 0.1 to 0.3 and particularly preferably 0.15 to 0.25. In particular, $z \geq x1_{max}$. The electron barrier layer has a larger band gap $E_g$ than the adjacent second waveguide layer 3B. This prevents electrons from leaving the waveguide region 3. Furthermore, the large band gap results in a low refractive index, which is advantageously small compared to the waveguide layers. This improves the wave guidance in waveguide region 3.

The first waveguide layer 3A and the second waveguide layer 3B, which directly adjoin the active layer 4, each comprise GaN or preferably InGaN. An indium component in the waveguide layers 3A, 3B reduces the band gap and increases the refractive index. The first and the second waveguide layers can in particular comprise $In_yGa_{1-y}N$ with $0.005 \leq y \leq 0.1$, preferably $In_yGa_{1-y}N$ with $0.02 \leq y \leq 0.07$ and particularly preferably $In_yGa_{1-y}N$ with $0.03 \leq y \leq 0.05$.

Figure 1C:
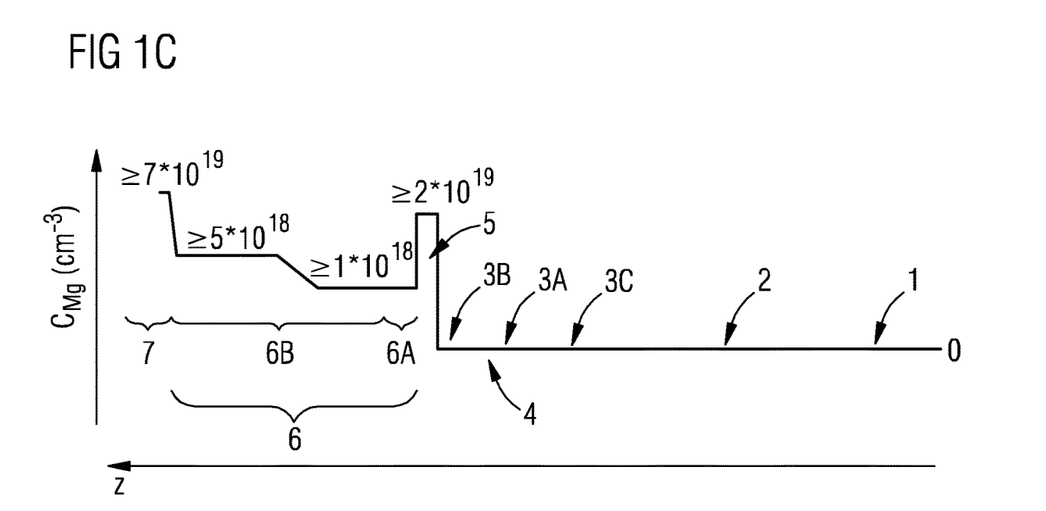
FIG. 1C shows a schematic diagram of the course of the dopant concentration $c_{Mg}$ of the p-dopant magnesium in the semiconductor layer sequence of the example of the laser diode according to FIG. 1A.

FIG. 1C schematically shows the course of the dopant concentration $c_{Mg}$ of the p-dopant magnesium in the semiconductor layer sequence of the example of the laser diode according to FIG. 1A. The dopant concentration in the electron barrier layer 5 is preferably at least $5*10^{18}$ cm$^{-3}$, particularly preferably at least $2*10^{19}$ cm$^{-3}$. The dopant concentration in the first partial layer 6A of the p-type cladding layer 6 is advantageously lower than in the electron barrier layer 5 to keep the absorption low. It is preferably $1*10^{18}$ cm$^{-3}$ to $5*10^{18}$ cm$^{-3}$. The dopant concentration in the second partial layer 6B can be higher or can rise to a higher value within the second partial layer than in the first partial layer 6A. For example, the dopant concentration in the second partial layer 6B is at least in some areas $5*10^{18}$ cm$^{-3}$ to $2*10^{19}$ cm$^{-3}$, preferably $1*10^{19}$ cm$^{-3}$ to $2*10^{19}$ cm$^{-3}$. The p-contact layer 7 preferably has an even higher dopant concentration, for example, more than $7*10^{19}$ cm$^{-3}$ and preferably more than $1*10^{20}$ cm$^{-3}$.

In FIGS. 2 to 9, the course of the electronic band gap $E_g$ in the semiconductor layer sequence is shown for modifications of the first example. The arrangement of the layers and other advantageous configurations of the layer system each correspond, unless otherwise stated, to the example in FIGS. 1A, 1B and 1C.

Figure 2:
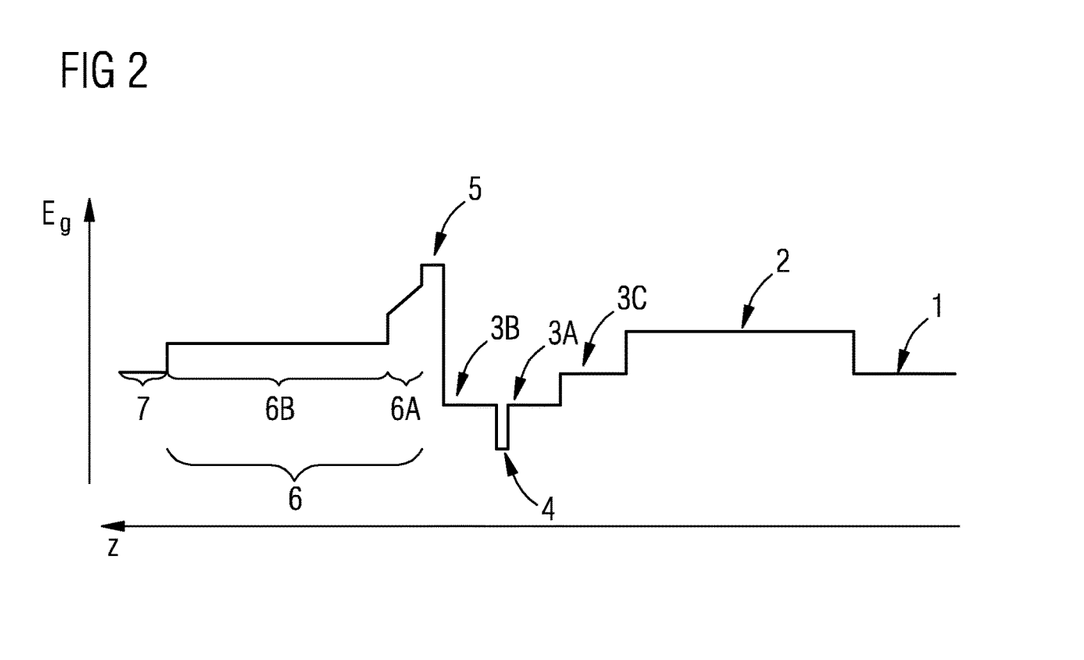
FIGS. 2 to 9 each show a schematic diagram of the band structure in further examples of the laser diode.
Figure 3:
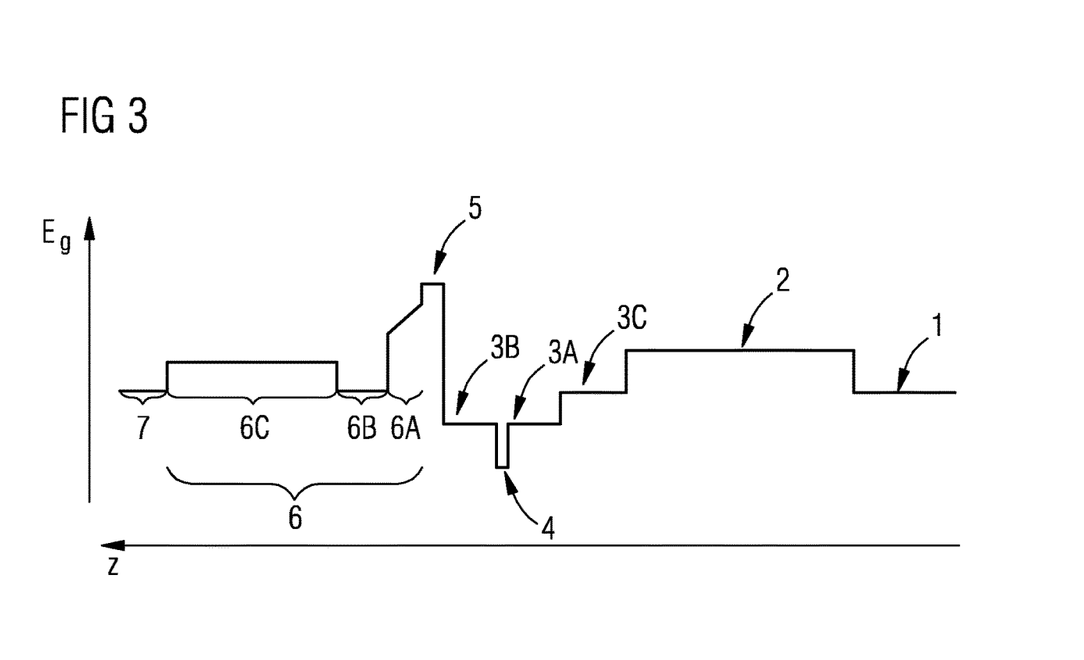

In the example shown in FIG. 2, the second partial layer 6B of the p-type cladding layer 6 has an aluminum content x2>0. The band gap $E_g$ in the second partial layer 6B is larger in this example than in the p-type contact layer 7, which comprises GaN in the example.

It is possible that the p-type cladding layer 6 has more than just two partial layers 6A, 6B. In the example shown in FIG. 3, the second partial layer 6B of the p-type cladding layer 6 has an aluminum content x2=0. This is followed by a third partial layer 6C having an aluminum content x2>0.

Figure 4:
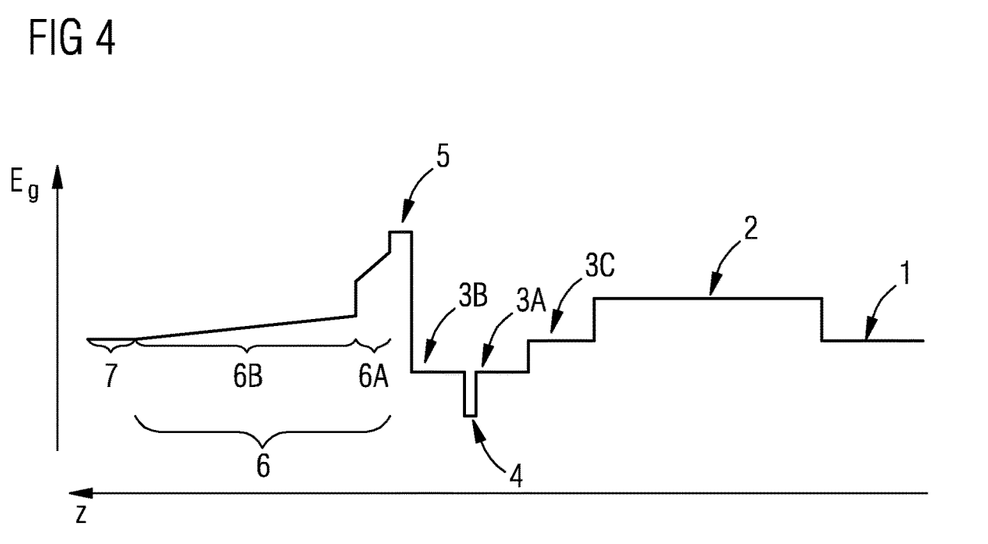

In the example shown in FIG. 4, both the first partial layer 6A and the second partial layer 6B of the p-type cladding layer 6 each have an aluminum content gradient, with the aluminum content decreasing in the direction away from the active layer 4, i.e. in the growth direction z. Between the first partial layer 6A and the second partial layer 6B, the aluminum content and thus the band gap $E_g$ have a step.

Figure 5:
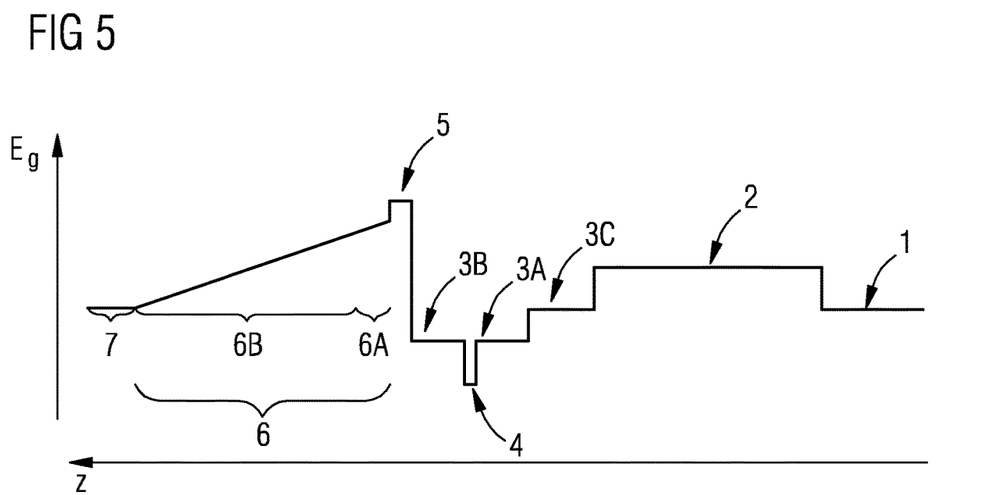

In the example shown in FIG. 5, both the first partial layer 6A and the second partial layer 6B of the p-type cladding layer 6 each have a gradient of aluminum content, with the aluminum content decreasing linearly in the direction away from the active layer 4, i.e. in the growth direction z. In contrast to the example in FIG. 4, the aluminum content at the interface between the first partial layer 6A and the second partial layer 6B does not have a step but is continuous. It is possible, however, that there is still an interface between the first partial layer 6A and the second partial layer 6B at which the material properties change abruptly. For example, the second partial layer 6B may have a higher dopant concentration than the first partial layer 6A.

Figure 6:
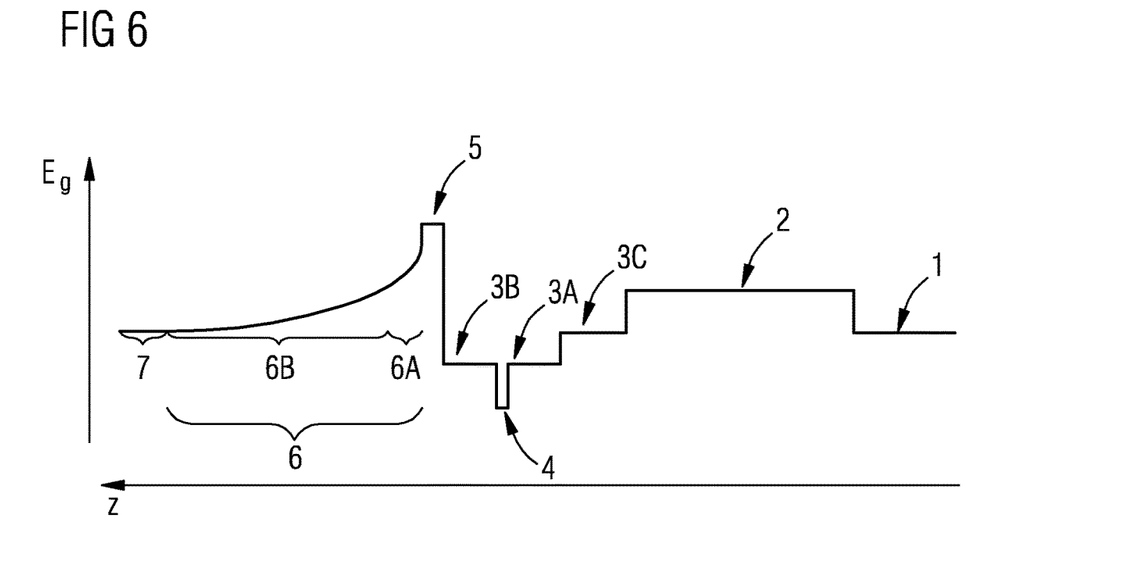

In the example shown in FIG. 6, both the first partial layer 6A and the second partial layer 6B of the p-type cladding layer 6 each have a gradient of aluminum content, with the aluminum content decreasing continuously in the direction away from the active layer 4, i.e. in the growth direction z. In contrast to the example shown in FIG. 5, the gradient is not a linear gradient. The aluminum content in the partial layers 6A, 6B can decrease according to any function, preferably continuously. In particular, the aluminum content has a strictly monotonically decreasing function in the growth direction z.

Figure 7:
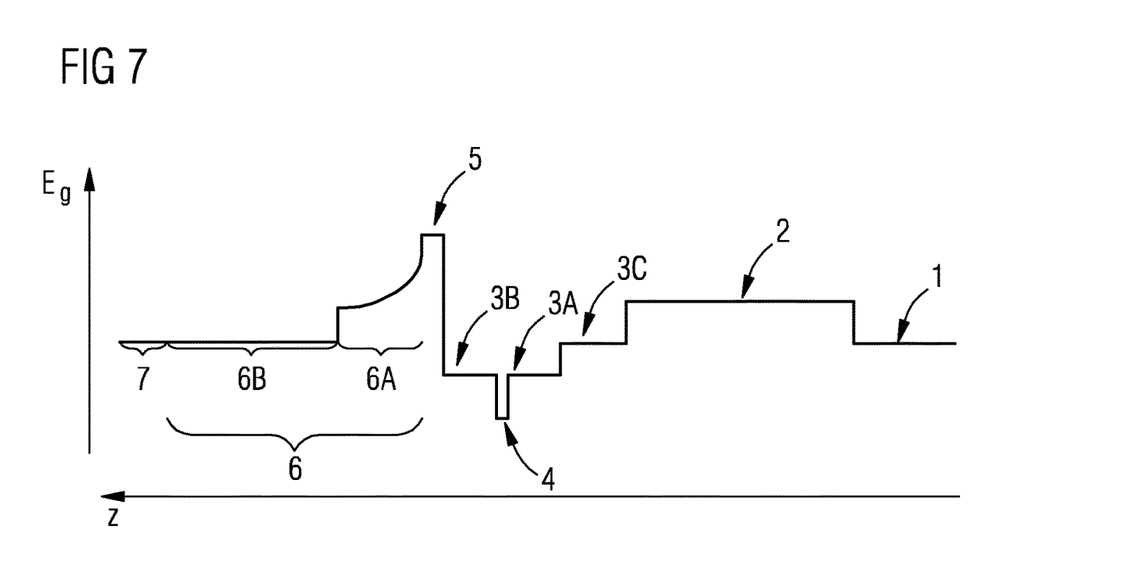

In the example shown in FIG. 7, only the first partial layer 6A of the p-type cladding layer 6 exhibits a gradient of the aluminum content, wherein the aluminum content decreases continuously according to a non-linear function. In the second partial layer 6B the aluminum content is zero, in particular the second partial layer is a GaN layer. Preferably, the gradient of the aluminum content x1 in the first partial layer 6A ends at a value x1>0, preferably $x1 \geq 0.04$. However, it is also possible that the aluminum content in the first partial layer 6A drops to the value x1=0.

Figure 8:
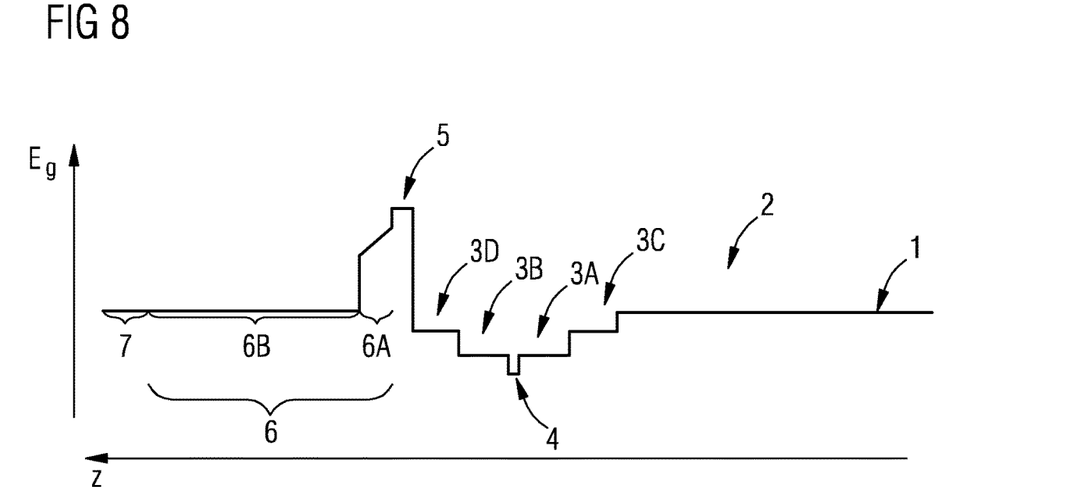

In the example shown in FIG. 8, the active layer 4 is located between a first waveguide layer 3A and a second waveguide layer 3B. As in the previous examples, a further waveguide layer 3C is placed between the first waveguide layer 3A and the n-type cladding layer 6. In addition, a further waveguide layer 3D is arranged between the second waveguide layer 3B and the electron barrier layer 5. The waveguide is thus two-stage on both sides of the active layer 4. It is possible that the n-type cladding layer 2 has only a low aluminum content or even no aluminum at all. For example, the n-type cladding layer can comprise $Al_zGa_{1-z}N$ with $0 \leq z \leq 0.05$. The absorption can be advantageously reduced in this way. In particular, the n-type cladding layer 2 is a GaN layer.

Figure 9:
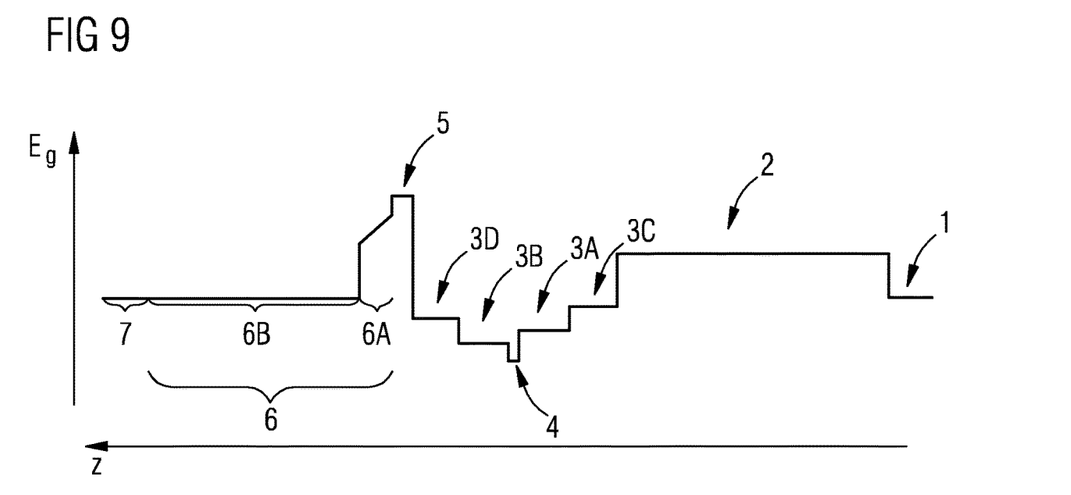

In the example shown in FIG. 9, the active layer 4 is arranged between a first waveguide layer 3A and a second waveguide layer 3B, as in the previous example, with a further waveguide layer 3C between the first waveguide layer 3A and the n-type cladding layer 2 and a further waveguide layer 3D between the second waveguide layer 3B and the electron barrier layer 5. The waveguide is thus multilevel on both sides of the active layer 4. The waveguide layers 3A, 3B, 3C, 3D are advantageously InGaN or GaN layers. In the example of FIG. 9, the waveguide is asymmetrical with respect to the active layer 4. In particular, the indium content on the p-side of the active layer 4 can be higher than on the n-side. Preferably, the second waveguide layer 3B adjacent to the active layer 4 at the p-side contains InGaN with a higher indium content than the first waveguide layer 3A adjacent to the active layer 4 at the n-side. Furthermore, it is advantageous if the further waveguide layer 3D adjacent to the second waveguide layer 3B at the p-side has a higher indium content than the further waveguide layer 3C adjacent to the first waveguide layer 3A at the n-side. The comparatively low indium content of the p-side waveguide layers 3B, 3D has the advantage that the charge carrier injection into the active layer 4 is improved.

Our laser diodes are not limited by the description based on the examples. Rather, this disclosure comprises every new feature as well as every combination of features, which in particular includes every combination of features in the appended claims, even if the feature or combination itself is not explicitly stated in the claims or examples.

This application claims priority of DE 10 2017 122 032.1, the subject matter of which is incorporated herein by reference.

The invention claimed is:

1. A laser diode having a semiconductor layer sequence based on a nitride compound semiconductor material, comprising
    an n-type cladding layer,
    a first waveguide layer, a second waveguide layer and an active layer that generates laser radiation disposed between the first waveguide layer and the second waveguide layer, and
    a p-type cladding layer comprising a first partial layer facing the active layer and a second partial layer facing away from the active layer, wherein
    the first partial layer comprises $Al_{x1}Ga_{1-x1}N$ with $0 \leq x1 \leq 1$ or $Al_{x1}In_{y1}Ga_{1-x1-y1}N$ with $0 \leq x1 \leq 1$, $0 \leq y1 < 1$ and $x1+y1 \leq 1$,
    the aluminum content x1 decreases in a direction pointing away from the active layer so that the aluminum content has a maximum value $x1_{max}$ on a side facing the active layer and a minimum value $x1_{min} < x1_{max}$ on a side remote from the active layer, and
    the second partial layer comprises $Al_{x2}Ga_{1-x2}N$ with $0 \leq x2 \leq x1_{min}$ or $Al_{x2}In_{y2}Ga_{1-x2-y2}N$ with $0 \leq x2 \leq x1_{min}$, $0 \leq y2 < 1$ and $x2+y2 \leq 1$.

2. The laser diode according to claim 1, wherein the first partial layer has an aluminum content of $0.05 \leq x1_{max} \leq 0.35$ on a side facing the active layer.

3. The laser diode according to claim 1, wherein the first partial layer has an aluminum content of $0.08 \leq x1_{max} \leq 0.25$ on a side facing the active layer.

4. The laser diode according to claim 1, wherein the first partial layer has an aluminum content of $0.12 \leq x1_{max} \leq 0.20$ on a side facing the active layer.

5. The laser diode according to claim 1, wherein the first partial layer has an aluminum content of $0 \leq x1_{min} \leq 0.30$ on a side remote from the active layer.

6. The laser diode according to claim 1, wherein the first partial layer has an aluminum content of $0.03 \leq x1_{min} \leq 0.15$ on a side remote from the active layer.

7. The laser diode according to claim 1, wherein the first partial layer has an aluminum content of $0.05 \leq x1_{min} \leq 0.10$ on a side remote from the active layer.

8. The laser diode according to claim 1, wherein the second partial layer comprises $Al_{x2}Ga_{1-x2}N$ with $0 \leq x2 \leq 0.1$.

9. The laser diode according to claim 1, wherein the second partial layer comprises GaN.

10. The laser diode according to claim 1, wherein the first partial layer is less than 300 nm thick.

11. The laser diode according to claim 1, wherein a transparent conductive oxide layer is disposed on a side of the p-type cladding layer remote from the active layer.

12. The laser diode according to claim 1, wherein an electron barrier layer is disposed between the second waveguide layer and the p-type cladding layer, the electron barrier layer comprises $Al_zGa_{1-z}N$, and the aluminum content z is greater than the aluminum content $x1_{max}$ of the first partial layer on a side facing the electron barrier layer.

13. The laser diode according to claim 1, wherein at least the first waveguide layer or the second waveguide layer comprises $In_yGa_{1-y}N$ with $0.005 \leq y \leq 0.1$.

14. The laser diode according to claim 1, wherein at least the first waveguide layer or the second waveguide layer comprises $In_yGa_{1-y}N$ with $0.02 \leq y \leq 0.07$.

15. The laser diode according to claim 1, wherein at least the first waveguide layer or the second waveguide layer comprises $In_yGa_{1-y}N$ with $0.03 \leq y \leq 0.05$.

16. The laser diode according to claim 1, wherein the dopant concentration in the second partial layer is higher or rises to a higher value at least in some areas than in the first partial layer.

17. The laser diode according to claim 1, wherein the first partial layer is less than 100 nm thick and the second partial layer is a GaN layer.

18. A laser diode having a semiconductor layer sequence based on a nitride compound semiconductor material, comprising
    an n-type cladding layer,
    a first waveguide layer, a second waveguide layer and an active layer that generates laser radiation disposed between the first waveguide layer and the second waveguide layer, and
    a p-type cladding layer comprising a first partial layer facing the active layer and a second partial layer facing away from the active layer, wherein
    the first partial layer comprises $Al_{x1}Ga_{1-x1}N$ with $0 \leq x1 \leq 1$ or $Al_{x1}In_{y1}Ga_{1-x1-y1}N$ with $0 \leq x1 \leq 1$, $0 \leq y1 < 1$ and $x1+y1 \leq 1$,
    the aluminum content x1 decreases in a direction pointing away from the active layer so that the aluminum content has a maximum value $x1_{max}$ on a side facing the active layer and a minimum value $x1_{min} \leq X1_{max}$ on a side remote from the active layer,
    the second partial layer comprises $Al_{x2}Ga_{1-x2}N$ with $0 \leq x2 \leq x1_{min}$ or $Al_{x2}In_{y2}Ga_{1-x2-y2}N$ with $0 \leq x2 \leq x1_{min}$, $0 \leq y2 < 1$ and $x2+y2 \leq 1$, and
    the dopant concentration in the second partial layer is higher or rises to a higher value at least in some areas than in the first partial layer.

* * * * *